(12) United States Patent
Kuriki et al.

(10) Patent No.: US 8,952,490 B2
(45) Date of Patent: Feb. 10, 2015

(54) REDOX CAPACITOR AND MANUFACTURING METHOD THEREOF

(75) Inventors: Kazutaka Kuriki, Kanagawa (JP); Kiyofumi Ogino, Kanagawa (JP); Yumiko Saito, Kanagawa (JP); Junichiro Sakata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 561 days.

(21) Appl. No.: 12/891,461

(22) Filed: Sep. 27, 2010

(65) Prior Publication Data
US 2011/0073991 A1 Mar. 31, 2011

(30) Foreign Application Priority Data

Sep. 30, 2009 (JP) ................................. 2009-227354

(51) Int. Cl.
*H01L 21/02* (2006.01)
*H01G 11/02* (2013.01)
(Continued)

(52) U.S. Cl.
CPC ................. *H01G 11/02* (2013.01); *Y02E 60/13* (2013.01); *H01G 11/28* (2013.01); *H01G 11/84* (2013.01);
(Continued)

(58) Field of Classification Search
CPC ........ H01L 28/40; H01G 11/56; H01G 11/70; H01G 11/02; H01G 9/22; H01G 9/038
USPC ............ 257/532, E21.008, E21.048; 438/381
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001711612 A | 12/2005 |
| CN | 001794363 A | 6/2006 |

(Continued)

OTHER PUBLICATIONS

Simon, Patrice and Gogotsi, Yury; "Materials for electrochemical capacitors"; Nov. 2008; Macmillian Publishers Limited; Nature Materials; vol. 7; p. 845-854.*

(Continued)

*Primary Examiner* — Stephen W Smoot
*Assistant Examiner* — Vicki B Booker
(74) *Attorney, Agent, or Firm* — Fish & Richardson P.C.

(57) ABSTRACT

To provide a redox capacitor that can be used at room temperature and a manufacturing method thereof. Amorphous semiconductor including hydrogen is used as an electrolyte of a redox capacitor. As a typical example of the amorphous semiconductor including hydrogen, an amorphous semiconductor including a semiconductor element such as amorphous silicon, amorphous silicon germanium, or amorphous germanium can be used. As another example of the amorphous semiconductor including hydrogen, oxide semiconductor including hydrogen can be used. As typical examples of the oxide semiconductor including hydrogen, an amorphous semiconductor including a single-component oxide semiconductor such as zinc oxide, titanium oxide, nickel oxide, vanadium oxide, and indium oxide can be given. As another example of oxide semiconductor including hydrogen, a multi-component oxide semiconductor such as $InMO_3(ZnO)_m$ (m>0 and M is one or more metal elements selected from Ga, Fe, Ni, Mn, and Co) can be used.

6 Claims, 7 Drawing Sheets

(51) Int. Cl.
  *H01G 9/022* (2006.01)
  *H01G 11/56* (2013.01)
  *H01L 49/02* (2006.01)
  *H01G 11/70* (2013.01)
  *H01G 9/22* (2013.01)
  *H01G 11/28* (2013.01)
  *H01G 11/84* (2013.01)
  *H01G 11/68* (2013.01)

(52) U.S. Cl.
  CPC ............ *H01G 11/68* (2013.01); *H01G 9/038* (2013.01); *H01G 11/56* (2013.01); *H01L 28/40* (2013.01); *H01G 11/70* (2013.01); *H01G 9/22* (2013.01)
  USPC .................. 257/532; 438/381; 257/E21.008; 257/E21.048

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,670,508 B2 | 3/2010 | Hara et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0068550 A1 | 4/2003 | Naoi et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0099474 A1 | 5/2006 | Hara et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0141316 A1 | 6/2006 | Kang |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203454 A1 | 8/2008 | Asami |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0098438 A1 | 4/2009 | Kunitake et al. |
| 2009/0114910 A1 | 5/2009 | Chang |
| 2009/0130499 A1 | 5/2009 | Honda et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0075322 A1* | 3/2011 | Kuriki et al. .................. 361/502 |

FOREIGN PATENT DOCUMENTS

| | | |
|---|---|---|
| EP | 1 737 044 A1 | 12/2006 |
| EP | 2 009 722 A1 | 12/2008 |
| EP | 2 226 847 A2 | 9/2010 |
| JP | 60-198861 A | 10/1985 |
| JP | 61-163570 A | 7/1986 |
| JP | 63-158761 A | 7/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-260765 A | 10/1989 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-109875 A | 4/2003 |
| JP | 2004-103957 A | 4/2004 |
| JP | 2004-273614 A | 9/2004 |
| JP | 2004-273732 A | 9/2004 |
| JP | 2006-245188 A | 9/2006 |
| JP | 2007-048569 A | 2/2007 |

(56) References Cited

FOREIGN PATENT DOCUMENTS

| JP | 2007-117810 A | 5/2007 |
|---|---|---|
| JP | 2007-123833 A | 5/2007 |
| JP | 2008-066681 A | 3/2008 |
| JP | 2008-244460 A | 10/2008 |
| JP | 2008-262853 A | 10/2008 |
| WO | 2004/047122 A1 | 6/2004 |
| WO | 2004/114391 A1 | 12/2004 |
| WO | 2007/105422 A1 | 9/2007 |

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the 1N2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—$ZnO$ systems at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT," SID Digest '08 : SID International Symposium Digest of Technical Papers, May 20, 2008, vol. 39, pp. 633-636.

Takahashi, M et al., "Theoretical Analysis of IgZo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/066634, dated Dec. 14, 2010, 3 pages.

Written Opinion, PCT Application No. PCT/JP2010/066634, dated Dec. 14, 2010, 5 pages.

Chinese Office Action (Application No. 201080044992.8) Dated Jun. 24, 2014.

\* cited by examiner

REDOX CAPACITOR AND MANUFACTURING METHOD THEREOF

TECHNICAL FIELD

The present invention relates to a redox capacitor and a manufacturing method thereof.

BACKGROUND ART

Electrochemical capacitors have been developed in recent years. The electrochemical capacitors include, in its category, an electric double-layer capacitor (EDLC) that utilizes capacitance formed by electrostatically storing positive and negative charges at interfaces between electrodes and an electrolytic solution, and a redox capacitor that utilizes capacitance that is stored along an electron transfer process (Faraday process) on an electrode surface.

As an electrolyte of the redox capacitor, an acid aqueous solution such as sulfuric acid or hydrochloric acid, cesium hydrogensulfate, or the like is used (see Patent Document 1 and Patent Document 2).

REFERENCE

[Patent Document 1] Japanese Published Patent Application No. 2003-109875
[Patent Document 2] Japanese Published Patent Application No. 2007-123833

Disclosure of Invention

However, in the case of using an acid aqueous solution as an electrolyte of the redox capacitor, there is a problem of corrosion of the electrode. In addition, in the case of using cesium hydrogensulfate as an electrolyte of the redox capacitor, cesium hydrogensulfate needs to be used at a temperature higher than or equal to about 143° C.: structural phase transition of cesium hydrogensulfate occurs at about 143° C. Meanwhile, for the usage at room temperature, moisture is necessary; thus, the redox capacitor needs to be used in an atmosphere in which the humidity is increased, which causes a problem of increase in size of the redox capacitor.

An object of an embodiment of the present invention is to provide a redox capacitor that can be used at room temperature and a manufacturing method thereof.

According to an embodiment of the present invention, amorphous semiconductor including hydrogen is used as an electrolyte of a redox capacitor. As the amorphous semiconductor including hydrogen, amorphous silicon, amorphous silicon germanium, or amorphous germanium can be used. As the amorphous semiconductor including hydrogen, oxide semiconductor including hydrogen can be used. As typical examples of the oxide semiconductor including hydrogen, zinc oxide, titanium oxide, nickel oxide, vanadium oxide, and indium oxide can be given. As the amorphous semiconductor including hydrogen, an In-M-Zn-oxide semiconductor (M is one or more metal elements selected from Al, Ga, Fe, Ni, Mn, and Co) can be used. A crystal of $InMO_3(ZnO)_m$ (m>0) may be included in the amorphous structure. Further, nitrogen may be included in the In-M-Zn-oxide semiconductor. When nitrogen is included, the hydrogen concentration in the In-M-Zn-oxide semiconductor can be increased.

According to an embodiment of the present invention, the electrolyte of the redox capacitor is formed by a sputtering method, a CVD method, a printing method, a sol-gel method, a dip coating method, or the like. After amorphous semiconductor is deposited over a substrate or an active material, heating is performed in an atmosphere containing hydrogen to form amorphous semiconductor including hydrogen as the electrolyte. Alternatively, after amorphous semiconductor is deposited over a substrate or an active material, hydrogen is added into the amorphous semiconductor by an ion doping method or an ion implantation method to form amorphous semiconductor including hydrogen as the electrolyte.

By employing an embodiment of the present invention, a redox capacitor which can operate at room temperature and has a simple structure can be manufactured.

BRIEF DESCRIPTION OF DRAWINGS

In the accompanying drawings.

BEST MODE FOR CARRYING OUT THE INVENTION

Figure 1:
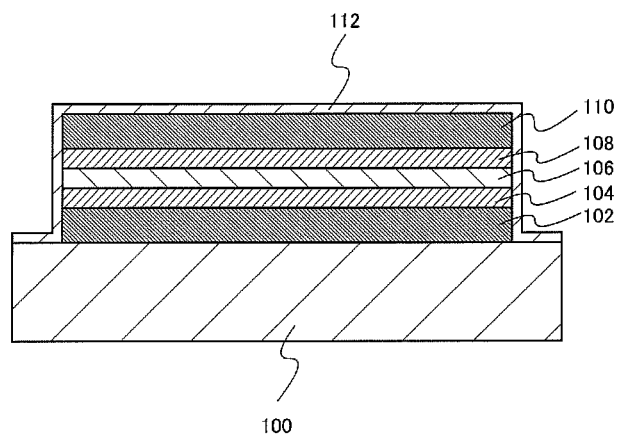
FIG. 1 is a cross-sectional view showing a structure of a redox capacitor.

Hereinafter, embodiments of the present invention will be described with reference to the drawings. Note that the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In description with reference to the drawings, in some cases, the same reference numerals are used in common for the same portions in different drawings. Further, in some cases, the same hatching patterns are applied to similar parts, and the similar parts are not necessarily designated by reference numerals.

Embodiment 1

In this embodiment, an embodiment of a redox capacitor structure will be described with reference to FIG. 1.

Over a substrate 100, a first current collector 102, a first active material 104 formed over the first current collector 102, an electrolyte 106 formed over the first active material 104, a second active material 108 formed over the electrolyte 106, and a second current collector 110 formed over the second active material 108 are included.

For the substrate 100, glass, quartz, ceramic such as alumina or plastic can be used. As the plastic, a fiberglass-reinforced plastics (FRP) plate, a polyvinyl fluoride (PVF) film, a polyester film, or an acrylic resin film can be used.

One of the first current collector 102 and the second current collector 110 functions as a positive electrode current collector, and the other functions as a negative electrode current collector. As the first current collector 102 and the second current collector 110, an element such as aluminum, nickel, titanium, copper, gold, silver, platinum, or cobalt or an alloy or a compound including the element is used.

Conductive carbon such as activated carbon or a conductive polymer such as polyaniline, polythiophene, or polypyrrole can be used as the first current collector 102 and the second current collector 110.

Although not illustrated in FIG. 1, one of the first current collector 102 and the second current collector 110 is connected to one of a positive electrode terminal and a negative electrode terminal, and the other of the first current collector 102 and the second current collector 110 is connected to the other of the positive electrode terminal and the negative electrode terminal.

One of the first active material 104 and the second active material 108 functions as a positive electrode active material, and the other functions as a negative electrode active material.

One or more of ruthenium oxide, iridium oxide, cobalt oxide, manganese oxide, tungsten oxide, niobium oxide, iron oxide, and the like can be used as the first active material 104 and the second active material 108.

In the case of using a conductive polymer such as polyaniline, polythiophene, or polypyrrole as the first current collector 102 and the second current collector 110, the conductive polymer functions as an active material as well as functioning as the current collector, without the first active material 104 and the second active material 108 provided.

The electrolyte 106 is formed using solid-state amorphous semiconductor including hydrogen. As a typical example of the amorphous semiconductor including hydrogen, an amorphous semiconductor including a semiconductor element such as amorphous silicon, amorphous silicon germanium, or amorphous germanium can be given. As another example of the amorphous semiconductor including hydrogen, an oxide semiconductor including hydrogen can be given, and typically an amorphous semiconductor including a single-component oxide semiconductor such as zinc oxide, titanium oxide, nickel oxide, vanadium oxide, or indium oxide can be given. Further, as another example of the oxide semiconductor including hydrogen, a multi-component oxide semiconductor such as an In-M-Zn-oxide semiconductor (M is one or more metal elements selected from Al, Ga, Fe, Ni, Mn, and Co) can be typically given: a crystal of $InMO_3(ZnO)_m$ (m>0) may be included in the amorphous structure. Further, nitrogen may be included in the In-M-Zn-oxide semiconductor. When nitrogen is included, the hydrogen concentration in the In-M-Zn-oxide semiconductor can be increased.

As an alternative to the above, an In—Sn-oxide semiconductor, an In—Sn—Zn-oxide semiconductor, an In—Al—Zn-oxide semiconductor, a Sn—Ga—Zn-oxide semiconductor, an Al—Ga—Zn-oxide semiconductor, a Sn—Al—Zn-oxide semiconductor, an In—Zn-oxide semiconductor, a Sn—Zn-oxide semiconductor, or an Al—Zn-oxide semiconductor can be used as the oxide semiconductor including hydrogen. Moreover, silicon oxide may be included in the above metal oxide.

The oxide semiconductor including hydrogen may be a hydrated oxide. The preferable hydration number of the hydrated oxide depends on the kind of the metal.

Note that a protective layer 112 may be provided around the redox capacitor. Silicon nitride, diamond like carbon (DLC), silicon oxide, or the like can be used for the protective layer 112. The protective layer 112 provided around the redox capacitor enables stable operation of the redox capacitor and the reduction of the deterioration.

A charging and discharging mechanism of the redox capacitor described in this embodiment will be described below. The following description is made using a redox capacitor in which an electrolyte is formed using an oxide semiconductor (M indicates metal and O indicates oxygen) including hydrogen.

Figure 2A:
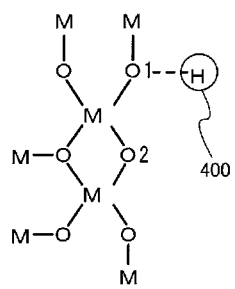
FIGS. 2A to 2C show a charging mechanism of a redox capacitor.
Figure 2B:
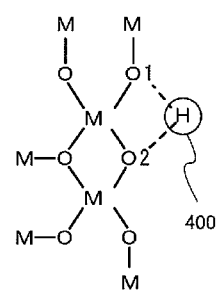
Figure 2C:
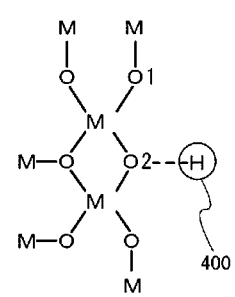

In the case of the charging reaction, when voltage is applied to the redox capacitor from the outside, H 400 bonded to O1 as illustrated in FIG. 2A is rearranged as illustrated in FIG. 2B and then forms a bond with O2 as illustrated in FIG. 2C. By this application of voltage to the amorphous semiconductor including hydrogen, hydrogen on the positive electrode side in the amorphous semiconductor is diffused by proton hopping and transfers to the negative electrode. Electrons transfer from the positive electrode to the negative electrode; thus, charging can be performed. Since amorphous semiconductor includes more defects than crystalline semiconductor, proton hopping of hydrogen is more likely to be caused in the amorphous semiconductor.

In the case of the discharging reaction, the reaction proceeds in the order reverse to the charging reaction, that is, in the order of FIG. 2C, FIG. 2B, and FIG. 2A. In other words, hydrogen on the negative electrode side in the amorphous semiconductor is diffused by proton hopping and transfers to the positive electrode and electrons flow from the negative electrode to the positive electrode; in this manner, a current flows.

Note that in the case where the amorphous semiconductor is amorphous silicon, amorphous silicon germanium, or amorphous germanium, since many defects are included therein, hydrogen transfers between electrodes by proton hopping through the defects in a similar manner; thus, charging and discharging can be performed.

As described above, a redox capacitor can be manufactured by using amorphous semiconductor including hydrogen as an electrolyte.

Embodiment 2

In this embodiment, a structure of a redox capacitor, which is different from the structure in Embodiment 1, will be described with reference to FIGS. 3A and 3B.

Figure 3A:
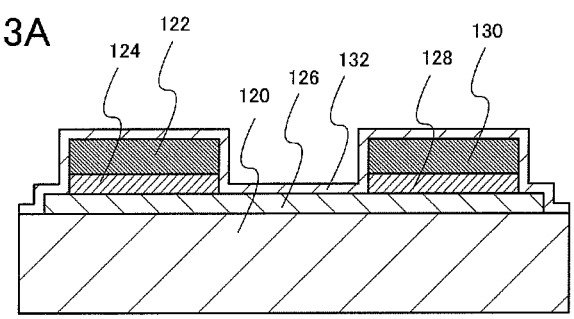
FIGS. 3A and 3B are cross-sectional views each showing a structure of a redox capacitor.

A redox capacitor illustrated in FIG. 3A includes an electrolyte 126 formed over a substrate 120, a first active material 124 and a second active material 128 which are formed over the electrolyte 126, a first current collector 122 formed over the first active material 124, and a second current collector 130 formed over the second active material 128.

Figure 3B:
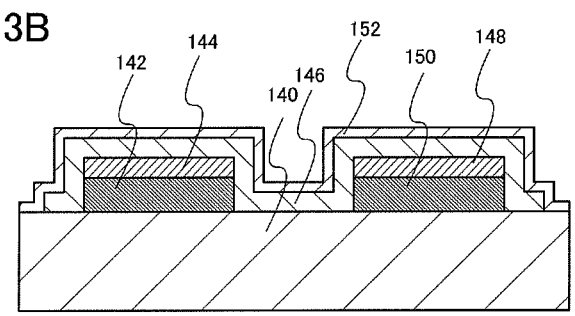

The redox capacitor illustrated in FIG. 3B includes a first current collector 142 and a second current collector 150 which are formed over a substrate 140, a first active material 144 formed over the first current collector 142, a second active material 148 formed over the second current collector 150, and an electrolyte 146 which covers side surfaces of the first current collector 142 and the second current collector 150 and top surfaces and side surfaces of the first active material 144 and the second active material 148.

The first current collectors 122 and 142 and the second current collectors 130 and 150 illustrated in FIGS. 3A and 3B can be formed using a material similar to that of the first current collector 102 and the second current collector 110 described in Embodiment 1.

The first active materials 124 and 144 and the second active materials 128 and 148 illustrated in FIGS. 3A and 3B can be formed using a material similar to that of the first active material 104 and the second active material 108 described in Embodiment 1.

The electrolytes 126 and 146 illustrated in FIGS. 3A and 3B can be formed using a material similar to that of the electrolyte 106 described in Embodiment 1.

Note that a protective layer 132 and a protective layer 152 may be provided around the redox capacitors. The protective layers 132 and 152 can be formed using a material similar to that of the protective layer 112 described in Embodiment 1.

Figure 4A:
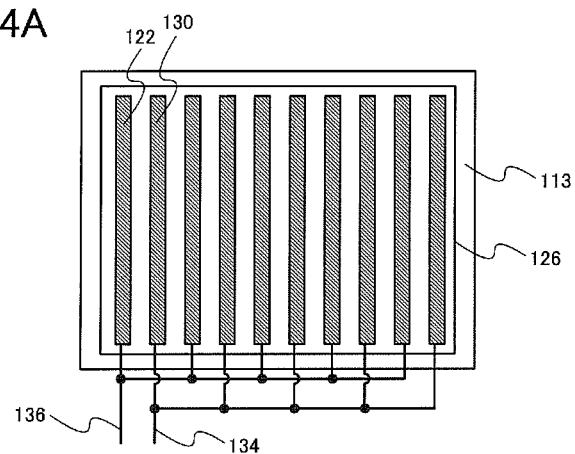
FIGS. 4A and 4B are plan views each showing a structure of a redox capacitor.
Figure 4B:
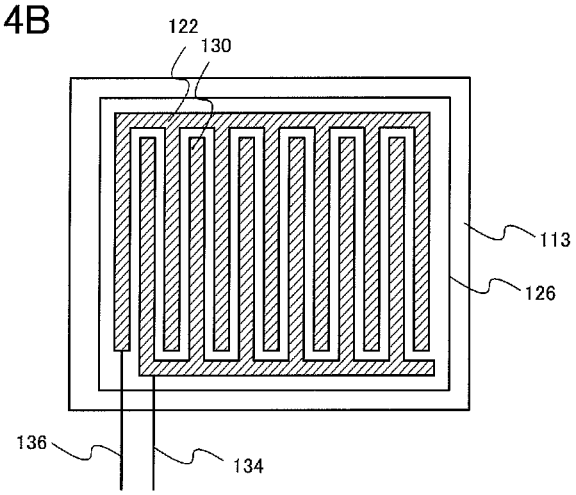

FIGS. 4A and 4B are plan views of the redox capacitor illustrated in FIG. 3A.

As illustrated in FIG. 4A, the first current collector 122 and the second current collector 130 can be arranged in parallel to each other. Alternatively, the first current collector 122 and the second current collector 130 may have a comb shape as illustrated in FIG. 4B. When the first current collector 122 and the second current collector 130 are arranged in parallel or have a comb shape in this manner, the facing area between the first current collector 122 and the second current collector 130 can be increased, whereby the discharging capacitance of the redox capacitor can be increased.

The first current collector 122 is connected to one 136 of a positive electrode terminal and a negative electrode terminal, and the second current collector 130 is connected to the other 134 of the positive electrode terminal and the negative electrode terminal. The connection method of the current collector and the positive or negative electrode terminal is not limited, and the combination of the current collectors with the positive electrode terminal and the negative electrode terminal may be changed as appropriate.

Note that the first current collector 142 and the second current collector 150 of the redox capacitor illustrated in FIG. 3B can also be arranged in a shape similar to either of the shapes illustrated in FIGS. 4A and 4B.

Embodiment 3

In this embodiment, redox capacitors capable of increasing the capacitance more than those of Embodiments 1 and 2 will be described with reference to FIGS. 5A to 5C. The redox capacitors described in this embodiment is characterized in that a first current collector or an electrolyte formed over a substrate has a projection and depression shape.

Figure 5A:
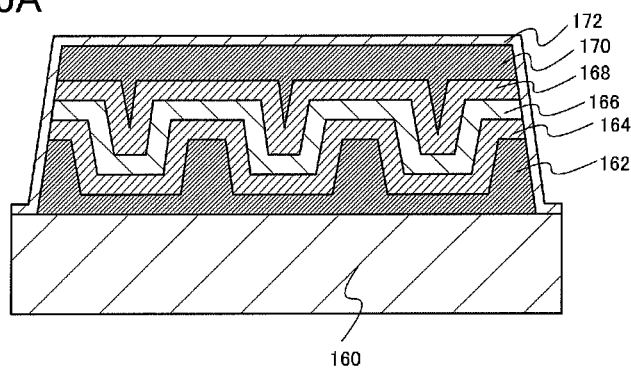
FIGS. 5A to 5C are cross-sectional views each showing a structure of a redox capacitor.

The redox capacitor illustrated in FIG. 5A includes a first current collector 162 having a projection and depression shape formed over a substrate 160, a first active material 164 formed over the first current collector 162, an electrolyte 166 formed over the first active material 164, a second active material 168 formed over the electrolyte 166, and a second current collector 170 formed over the second active material 168.

Figure 5B:
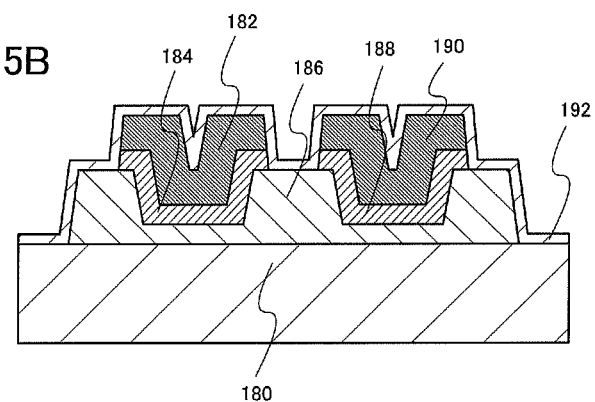

The redox capacitor illustrated in FIG. 5B includes an electrolyte 186 having a projection and depression shape formed over a substrate 180, a first active material 184 and a second active material 188 which are formed over the electrolyte 186, a first current collector 182 formed over the first active material 184, and a second current collector 190 formed over the second active material 188.

Figure 5C:
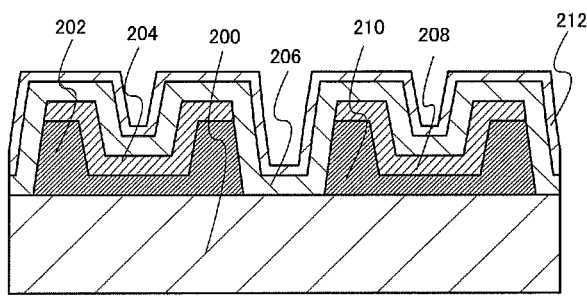

The redox capacitor illustrated in FIG. 5C includes a first current collector 202 and a second current collector 210 each having a projection and depression shape and formed over a substrate 200, a first active material 204 formed over the first current collector 202, a second active material 208 formed over the second current collector 210, and an electrolyte 206 which covers side surfaces of the first current collector 202 and the second current collector 210 and top surfaces and side surfaces of the first active material 204 and the second active material 208.

The first current collectors 162, 182, and 202 and the second current collectors 170, 190, and 210 illustrated in FIGS. 5A to 5C can be formed using a material similar to that of the first current collector 102 and the second current collector 110 described in Embodiment 1.

The first active materials 164, 184, and 204 and the second active materials 168, 188, and 208 illustrated in FIGS. 5A to 5C can be formed using a material similar to that of the first active material 104 and the second active material 108 described in Embodiment 1.

The electrolytes 166, 186, and 206 illustrated in FIGS. 5A to 5C can be formed using a material similar to that of the electrolyte 106 described in Embodiment 1.

Note that a protective layer 172, a protective layer 192, and a protective layer 212 may be provided so as to cover the redox capacitors. The protective layers 172, 192, and 212 can be formed using a material similar to that of the protective layer 112 described in Embodiment 1.

When a current collector formed over a substrate has a projection and depression shape, the contact area between an active material and an electrolyte, which are stacked over the current collector, is increased. Further, when an electrolyte formed over a substrate has a projection and depression shape, the contact area between the electrolyte and the active material formed over the electrolyte is increased. Accordingly, the discharging capacitance of the redox capacitor can be increased as compared to that of Embodiments 1 and 2.

Embodiment 4

In this embodiment, a manufacturing method of a redox capacitor will be described. In this embodiment, a manufacturing method of the redox capacitor described in Embodiment 1 will be described.

As illustrated in FIG. 1, the first current collector 102 is formed over the substrate 100. The first current collector 102 is formed by a sputtering method, an evaporation method, a plating method, a printing method, a CVD method, an ink jet method, or the like.

Next, the first active material 104 is formed over the first current collector 102. The first active material 104 is formed by a sputtering method, an evaporation method, a printing method, or the like.

Next, the electrolyte 106 is formed over the first active material 104. The electrolyte 106 is formed by a sputtering method, a CVD method, a printing method, a sol-gel method, a dip coating method, an ink-jet method, or the like.

In the case of forming the electrolyte 106 using a sputtering method, sputtering is performed using semiconductor including hydrogen as a target and using a rare gas or a rare gas and hydrogen as a sputtering gas; thus, amorphous semiconductor including hydrogen can be deposited over the first active material 104. Note that in the case of using hydrogen as the sputtering gas, the target need not necessarily include hydrogen. Typically, sputtering is performed using a silicon target including hydrogen, a germanium target including hydrogen, or a silicon germanium target including hydrogen, and using a rare gas and/or hydrogen as a sputtering gas to deposit amorphous silicon, amorphous germanium, or amorphous silicon germanium. Alternatively, in the sputtering, zinc oxide including hydrogen, titanium oxide including hydrogen, nickel oxide including hydrogen, vanadium oxide including hydrogen, indium oxide including hydrogen, or an In-M-Zn-oxide semiconductor including hydrogen (M is one or more metal elements selected from Al, Ga, Fe, Ni, Mn, and Co) can be used as a target, and a rare gas and/or hydrogen can be used as a sputtering gas to deposit amorphous semiconductor including hydrogen over the first active material 104. Note that in the case of using hydrogen as the sputtering gas, the target need not necessarily include hydrogen. Reactive sputtering can be used. Typically, sputtering is performed using zinc, titanium, nickel, vanadium, indium, or an In-M-Zn (M is one or more metal elements selected from Al, Ga, Fe, Ni, Mn, and Co) as a target, and using a rare gas and oxygen, or a rare gas, oxygen, and hydrogen as a sputtering gas; thus, amorphous semiconductor including hydrogen can be deposited over the first active material 104. Note that in the case where hydrogen is included in the target, hydrogen need not necessarily be used for the sputtering gas.

Further, in the case of forming the electrolyte 106 using a CVD method, a gas including a hydrogen atom is used as a source gas in the CVD method; thus, amorphous semiconductor including hydrogen can be deposited over the first active material 104. Typically, the amorphous semiconductor including hydrogen can be deposited over the first active material 104 using a plasma CVD method with the use of silane, disilane, and/or germane. Note that hydrogen or hydrogen and a rare gas may be used as the source gas.

Then, the second active material 108 is formed over the electrolyte 106. The second active material 108 can be formed in a manner similar to that of the first active material 104.

Next, the second current collector 110 is formed over the second active material 108. The second current collector 110 can be formed in a manner similar to that of the first current collector 102.

Then, the protective layer 112 may be formed by a sputtering method, a CVD method, or the like. Further, an adhesive sheet may be attached.

Through the above-described process, a redox capacitor can be manufactured.

Although a manufacturing method of the redox capacitor having the structure of Embodiment 1 is described in this embodiment, this embodiment can be applied to manufacturing methods of the redox capacitors having the structures of Embodiment 2 and 3 as appropriate. In the redox capacitors illustrated in FIGS. 3A and 3B of Embodiment 2 and the redox capacitors illustrated in FIGS. 5B and 5C of Embodiment 3, the first current collector and the second current collector can be formed at the same time. In addition, the first active material and the second active material can be formed at the same time. Therefore, the number of steps for manufacturing the redox capacitors can be reduced.

The first current collector 162 having a projection and depression shape, the electrolyte 186 having a projection and depression shape, and the first current collector 202 and the second current collector 210 each having a projection and depression shape, which are described in Embodiment 3, can be formed in such a manner that a thin film is formed over a substrate, a resist mask having a projection and depression shape is formed over the thin film in a photolithography process, and the thin film over the substrate is etched anisotropically with the use of the resist mask. Note that the resist mask having a projection and depression shape can be formed in a photolithography process in which a half-tone mask or a gray-tone mask is used. Alternatively, the resist mask having a projection and depression shape can be formed by reduced-projection light exposure with the use of a stepper.

In this embodiment, a plurality of redox capacitors can be manufactured over one substrate using a semiconductor manufacturing apparatus, so that productivity can be increased.

Embodiment 5

In this embodiment, a manufacturing method of the electrolyte 106, which is different from that in Embodiment 4, will be described.

This embodiment is characterized in that after amorphous semiconductor is formed over the first active material 104, hydrogen is added into the amorphous semiconductor. Typically, after amorphous semiconductor is deposited over the first active material 104, heating is performed in a hydrogen atmosphere, whereby amorphous semiconductor including hydrogen can be formed as the electrolyte 106. Alternatively, after amorphous semiconductor is deposited over the first active material 104, hydrogen may be added into the amorphous semiconductor by an ion doping method or an ion implantation method, so that amorphous semiconductor including hydrogen can be formed as the electrolyte 106.

In this embodiment, a plurality of redox capacitors can be manufactured over one substrate using a semiconductor manufacturing apparatus, so that productivity can be increased.

Embodiment 6

Sealing structures of the redox capacitors described in Embodiments 1 to 3 will be described with reference to FIGS. 6A and 6B. In this embodiment, description is made using the redox capacitor described in Embodiment 2.

Figure 6A:
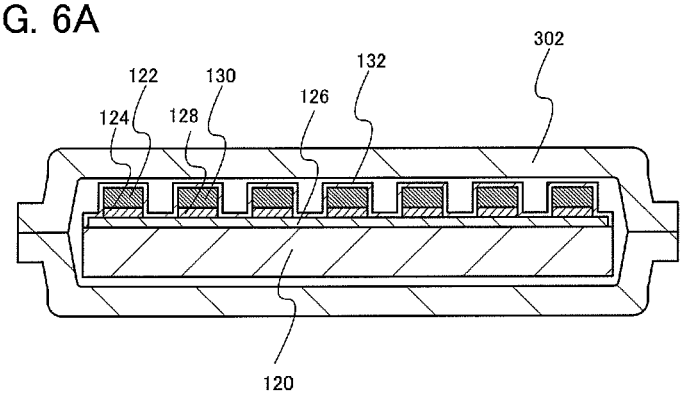
FIGS. 6A and 6B are cross-sectional views each showing a structure of a redox capacitor.

As illustrated in FIG. 6A, the redox capacitor is sealed with a sealing member 302. In this case, although not illustrated, an external terminal connected to the first current collector 122 and an external terminal connected to the second current collector 130 protrude through the sealing member 302. Note that the atmosphere inner than the sealing member 302 may have a reduced pressure. The region inner than the sealing member 302 may be filled with an inert gas. As the sealing member 302, a laminated film, a metal sealant can, or the like can be used. In FIG. 6A, a plurality of substrates over which a redox capacitor is formed may be stacked so that the redox capacitors are connected in series or in parallel.

Figure 6B:
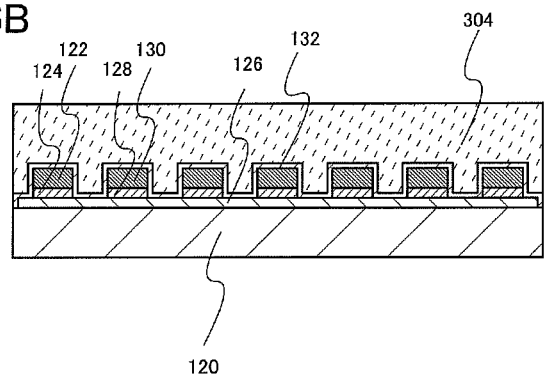

As illustrated in FIG. 6B, the redox capacitor can be sealed with an organic resin 304. In this case, although not illustrated, an external terminal connected to the first current collector 122 and an external terminal connected to the second current collector 130 protrude through the organic resin 304. Since the electrolytes in the redox capacitors of Embodiments 1 to 3 are solid, the redox capacitors can be easily sealed with the organic resin 304. Note that in FIG. 6B, a plurality of substrates over which a redox capacitor is formed may be stacked so that the redox capacitors are connected in series or in parallel and then the redox capacitors may be sealed with the organic resin 304.

When redox capacitors formed over different substrates are connected in series, charge voltage and discharge voltage can be increased. When redox capacitors formed over different substrates are connected in parallel, capacitance can be increased.

Example 1

In this example, a manufacturing method of a redox capacitor in which an In—Ga—Zn oxide semiconductor including hydrogen as an electrolyte is used, and measurement results of electric characteristics of the redox capacitor by cyclic voltammetry will be described.

A film of In—Ga—Zn-oxide semiconductor including hydrogen with a thickness of 100 nm was formed as an electrolyte over a glass substrate by a sputtering method. The film formation conditions at this time are as follows. The composition of the target was In:Ga:Zn=1:1:0.5, 30 sccm of Ar and 15 sccm of $O_2$ were used for a sputtering gas, the pressure was 0.4 Pa, the power supply voltage was 0.5 kW, the distance between electrodes was 60 mm, and the film formation temperature was room temperature. The composition of the In—Ga—Zn-oxide semiconductor formed over the glass substrate was analyzed with an electron probe X-ray microanalyzer (EPMA), so that the composition was found to be as follows: O:Ga:In:Zn=61.3:15.8:16.8:6. In addition, the concentration of hydrogen was found to be $7\times10^{20}$ atoms/cm$^3$ by secondary ion mass spectrometry (SIMS).

Next, two carbon plates having a thickness of 0.5 mm, a width of 10 mm, and a length of 63 mm were prepared as current collectors, a mixture including ruthenium oxide was applied onto the carbon plates, and then the surfaces on which the mixture including ruthenium oxide was applied were pressed on the electrolyte. The distance between the two carbon plates was 1 mm at this time. A mixture including 0.05 g of ruthenium oxide and 1 ml of water was used as the mixture of ruthenium oxide at this time.

Then, in order to keep insulation between the two carbon plates, an adhesive sheet is pressure-bonded to the exposed In—Ga—Zn-oxide semiconductor, so that a redox capacitor was manufactured.

Next, electric characteristics of the redox capacitor were measured by cyclic voltammetry. The measurement conditions at this time were as follows: the charge voltage and discharge voltage were 0 V to 1 V, the scanning speed was 100 mV/s, the number of cycles was five, and the measurement interval was 100 ms. The cyclic voltammogram at this time is shown in FIG. 7.

Figure 7:
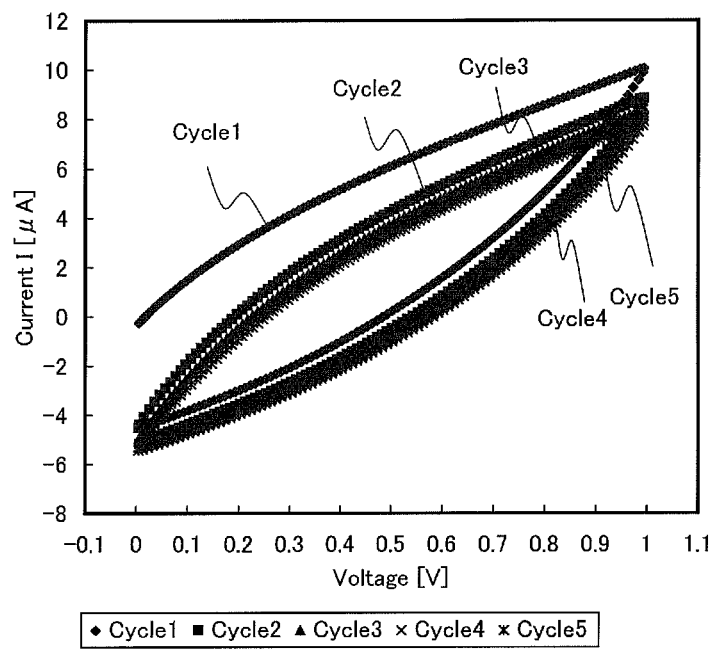
FIG. 7 shows a cyclic voltammogram of a redox capacitor.

From FIG. 7, it can be found that a redox capacitor can be manufactured using an In—Ga—Zn-oxide semiconductor for an electrolyte.

This application is based on Japanese Patent Application serial no. 2009-227354 filed with Japan Patent Office on Sep. 30, 2009, the entire contents of which are hereby incorporated by reference.

EXPLANATION OF REFERENCE

100: substrate, 102: current collector, 104: active material, 106: electrolyte, 108: active material, 110: current collector, 112: protective layer, 120: substrate, 122: current collector, 124: active material, 126: electrolyte, 128: active material, 130: current collector, 132: protective layer, 134: the other of a positive electrode terminal and a negative electrode terminal, 136: one of a positive electrode terminal and a negative electrode terminal, 140: substrate, 142: current collector, 144: active material, 146: electrolyte, 148: active material, 150: current collector, 160: substrate, 162: current collector, 164: active material, 166: electrolyte, 168: active material, 170: current collector, 172: protective layer, 180: substrate, 182: current collector, 184: active material, 186: electrolyte, 188: active material, 190: current collector, 200: substrate, 202: current collector, 204: active material, 206: electrolyte, 208: active material, 210: current collector, 302: sealing member, and 304: organic resin.

The invention claimed is:

1. A redox capacitor comprising an electrolyte formed using an oxide semiconductor including hydrogen, wherein the oxide semiconductor is In—Ga—Zn-oxide including a crystal.

2. The redox capacitor according to claim 1, wherein the oxide semiconductor further includes nitrogen.

3. A redox capacitor comprising an electrolyte formed using an oxide semiconductor including hydrogen, wherein the oxide semiconductor comprises indium, gallium, zinc, and nitrogen.

4. A redox capacitor comprising:
a first active material;
a first current collector in contact with the first active material;
an electrolyte in contact with the first current collector;
a second current collector in contact with the electrolyte; and
a second active material in contact with the second current collector,
wherein the electrolyte comprises an oxide semiconductor including hydrogen, and
wherein the oxide semiconductor In—Ga—Zn-oxide including a crystal.

5. The redox capacitor according to claim 4, wherein the oxide semiconductor further includes nitrogen.

6. A redox capacitor comprising:
a first active material;
a first current collector in contact with the first active material;
an electrolyte in contact with the first current collector;
a second current collector in contact with the electrolyte; and
a second active material in contact with the second current collector,
wherein the electrolyte comprises an oxide semiconductor including hydrogen, and
wherein the oxide semiconductor comprises indium, gallium, zinc, and nitrogen.

* * * * *

UNITED STATES PATENT AND TRADEMARK OFFICE
CERTIFICATE OF CORRECTION

PATENT NO. : 8,952,490 B2  
APPLICATION NO. : 12/891461  
DATED : February 10, 2015  
INVENTOR(S) : Kazutaka Kuriki et al.

Page 1 of 1

It is certified that error appears in the above-identified patent and that said Letters Patent is hereby corrected as shown below:

In the Claims

Column 10, line 31, claim 4, after "semiconductor" insert --is--.

Signed and Sealed this
Seventeenth Day of November, 2015

Michelle K. Lee
*Director of the United States Patent and Trademark Office*